(12) United States Patent
Leobandung et al.

(10) Patent No.: US 9,530,665 B2
(45) Date of Patent: Dec. 27, 2016

(54) PROTECTIVE TRENCH LAYER AND GATE SPACER IN FINFET DEVICES

(71) Applicant: International Business Machines Corporation, Armonk, NY (US)

(72) Inventors: Effendi Leobandung, Stormville, NY (US); Richard S. Wise, Ridgefield, CT (US)

(73) Assignee: International Business Machines Corporation, Armonk, NY (US)

(*) Notice: Subject to any disclaimer, the term of this patent is extended or adjusted under 35 U.S.C. 154(b) by 50 days.

(21) Appl. No.: 14/313,340

(22) Filed: Jun. 24, 2014

(65) Prior Publication Data

US 2015/0371867 A1    Dec. 24, 2015

(51) Int. Cl.
| H01L 21/311 | (2006.01) |
| H01L 29/66 | (2006.01) |
| H01L 21/8238 | (2006.01) |
| H01L 27/092 | (2006.01) |
| H01L 27/088 | (2006.01) |
| H01L 27/12 | (2006.01) |
| H01L 21/8234 | (2006.01) |

(52) U.S. Cl.
CPC . *H01L 21/31116* (2013.01); *H01L 21/823821* (2013.01); *H01L 21/823864* (2013.01); *H01L 27/0924* (2013.01); *H01L 29/66795* (2013.01); *H01L 21/823431* (2013.01); *H01L 21/823468* (2013.01); *H01L 27/0886* (2013.01); *H01L 27/1211* (2013.01)

(58) Field of Classification Search
CPC ........... H01L 29/785; H01L 21/823821; H01L 29/66772; H01L 2027/11857; H01L 27/1203; H01L 29/7812; H01L 29/7824; H01L 21/76205; H01L 29/41766; H01L 29/4236; H01L 29/7397
See application file for complete search history.

(56) References Cited

U.S. PATENT DOCUMENTS 7,646,070 B2 * 1/2010 Anderson ......... H01L 29/66795
                                                                257/401
8,692,316 B2    4/2014 Xie
(Continued)

OTHER PUBLICATIONS

Pending U.S. Appl. No. 13/853,090, filed on Mar. 29, 2013, entitled: "Asymmetric Spacers".
(Continued)

*Primary Examiner* — Bac Au
(74) *Attorney, Agent, or Firm* — Steven J. Meyers; Howard M. Cohn

(57) ABSTRACT

Forming a field effect transistor device includes forming first and second semiconductor fins on a semiconductor substrate. The first and second semiconductor fins are separated by a trench region. The trench region has a first sidewall corresponding to a sidewall of the first semiconductor fin and a second sidewall corresponding to a sidewall of the second semiconductor fin. A gate stack is arranged over respective channel regions of the first and semiconductor fins. A first sidewall of the gate stack corresponds to a third sidewall of the trench region. A protective layer is formed only on a bottom portion of the trench region and along the first sidewall of the gate stack. The protective layer along the first sidewall of the gate stack defines a gate spacer.

10 Claims, 11 Drawing Sheets

(56) References Cited

U.S. PATENT DOCUMENTS

| | | | |
|---|---|---|---|
| 9,111,962 B1* | 8/2015 | Alptekin | H01L 29/66795 |
| 2011/0127610 A1* | 6/2011 | Lee | H01L 29/785 257/365 |
| 2011/0291188 A1* | 12/2011 | Cheng | H01L 29/785 257/347 |
| 2013/0292805 A1* | 11/2013 | Cai | H01L 29/66795 257/622 |
| 2015/0108544 A1* | 4/2015 | Ching | H01L 21/82382 257/192 |

OTHER PUBLICATIONS

Pending U.S. Appl. No. 13/853,088, filed on Mar. 29, 2013, entitled: "Angled Gas Cluster Ion Beam".

* cited by examiner

PROTECTIVE TRENCH LAYER AND GATE SPACER IN FINFET DEVICES

FIELD OF THE INVENTION

The present invention relates generally to semiconductor fabrication, and more particularly, to fin field effect transistor (finFET) structures and methods of fabrication.

BACKGROUND

Fin field effect transistors (finFET) are part of an emerging technology which provides solutions to field effect transistor (FET) scaling problems at, and below, the 22 nm node. FinFET structures include at a narrow semiconductor fin gated on at least two sides of the semiconductor fin. FinFET structures may be formed on a semiconductor-on-insulator (SOI) substrate, because of the low source/drain diffusion, low substrate capacitance, and ease of electrical isolation by shallow trench isolation structures.

In typical finFET fabrication process steps, the surface of a semiconductor substrate, such as a silicon wafer, is treated using various deposition and removal techniques that shape the surface to a desired structure and composition. For example, one step in forming a finFET structure may include forming a pure and contaminant free epitaxial layer on the substrate. Therefore, it may be necessary to clean the underlying surface of the substrate prior to forming the epitaxial layer. In addition to cleaning the substrate surface, known epitaxy pre-clean methods typically may have adverse effects on the substrate by, for example, removing material from the substrate that should not be removed.

SUMMARY

In a method for forming a field effect transistor device (finFET), according to an aspect of the present invention, two or more semiconductor fins are formed adjacent to one another on a semiconductor substrate. The area separating the two fins defines a trench region. The trench region may have at least three sidewalls. The first and second sidewalls of the trench region may be defined by opposite facing sidewalls of the two fins. A gate stack may be arranged over the two fins. A first sidewall of the gate stack is adjacent to the trench region and defines a third sidewall of the trench region. A protective layer may be formed only on at least the first sidewall of the gate stack and only on a bottom portion of the trench region in direct contact with the semiconductor substrate. The protective layer along the first sidewall of the gate stack defines a gate spacer.

In another method, according to a further embodiment, for each of two or more finFETs, two or more semiconductor fins are formed adjacent to one another on a semiconductor substrate. The area separating the two fins defines a trench region. The trench region may have at least three sidewalls. The first and second sidewalls of the trench region may be defined by opposite facing sidewalls of the two fins. A gate stack may be arranged over the two fins. A first sidewall of the gate stack is adjacent to the trench region and defines a third sidewall of the trench region. A protective layer may be formed only on at least the first sidewall of the gate stack and only on a bottom portion of the trench region in direct contact with the semiconductor substrate. The protective layer along the first sidewall of the gate stack defines a gate spacer. One of the two or more finFETs may be an n-doped finFET (NFET), and another of the two or more finFETs may be a p-doped finFET (PFET).

According to a further embodiment, a field effect transistor device may include two semiconductor fins adjacent to one another and separated by a trench region. The trench region may have at least three sidewalls. Opposite facing sidewalls of the two fins define first and second sidewalls of the trench region. A gate stack is arranged over the two fins. A first sidewall of the gate stack adjacent to the trench region defines a third sidewall of the trench region. A protective layer is only on at least the first sidewall of the gate stack and only on a bottom portion of the trench region in direct contact with the semiconductor substrate. The protective layer along the first sidewall of the gate stack defines a gate spacer.

DETAILED DESCRIPTION

Figure 1A:
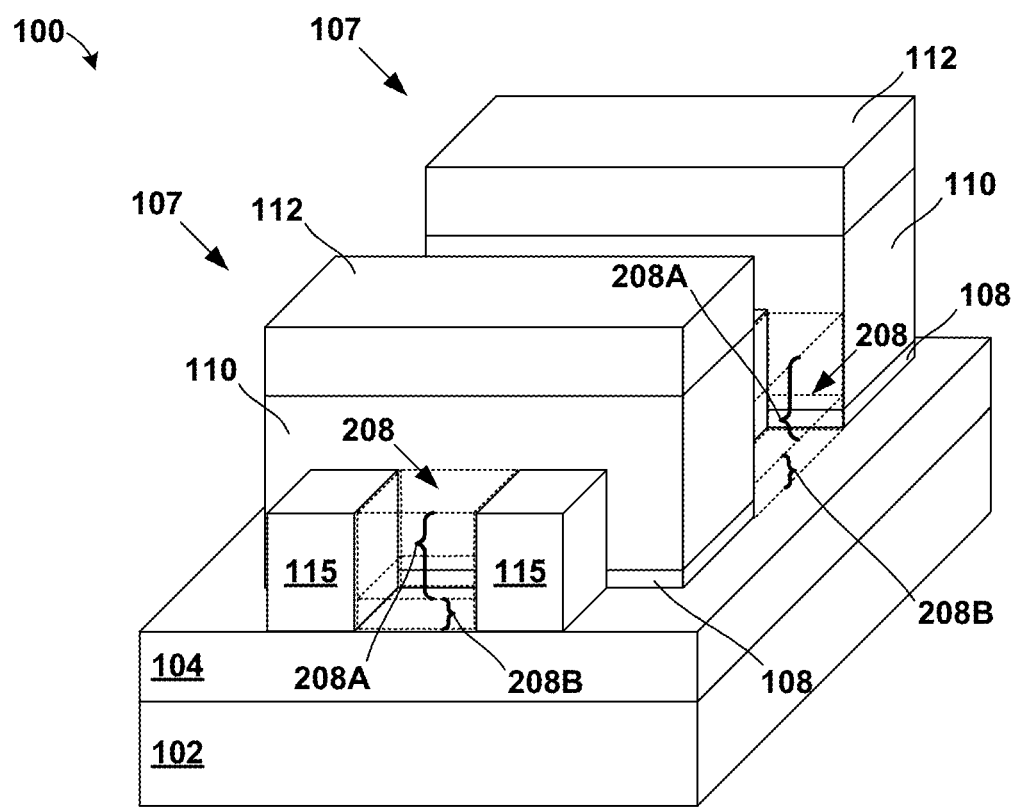
FIG. 1A depicts an isometric view of a finFET semiconductor device (finFET), according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The drawings are not necessarily to scale. The drawings are merely schematic representations, not intended to portray specific parameters of the invention. The drawings are intended to depict only typical embodiments of the invention. In the drawings, like numbering represents like elements.

A finFET device may include a plurality of fins formed in a wafer; a gate covering a portion of the fins, where the portion of the fins covered by the gate serves as a channel region of the device and portions of the fins extending out from under the gate may serve as source and drain regions of the device; and a pair of device spacers on opposite sides of the gate. It should be noted that the fins in the invention disclosed below may be fabricated using either a subtractive fin method, a replacement fin method, or any other method for forming a fin structure on a semiconductor substrate. Additionally, the gate stack may be formed using a fin replacement gate or gate last process flow, or a gate first process flow.

Referring now to FIG. 1A, an isometric view of a finFET 100 is shown. At this step of fabrication, the finFET 100 may include one or more gate stacks 107 formed over one or more fins 115 etched from a semiconductor-on-insulator (SOI) substrate. It should be noted that the gate stack 107 and fin 115 may be formed in any semiconductor substrate known to a person having ordinary skill in the art, including but not limited to, SOI substrates and bulk silicon substrates. However, an SOI substrate will be relied upon for purposes of the following description. Also, it should be noted that while this description refers to some components of the finFET 100 in the singular tense, more than one component may be depicted throughout the figures and like components are labeled with like reference characters.

The SOI substrate employed in the present embodiment may include a base substrate 102, a buried dielectric layer 104 (e.g., buried oxide) formed on top of the base substrate 102, and an SOI layer (not shown) formed on top of the buried dielectric layer 104. The buried dielectric layer 104 isolates the SOI layer from the base substrate 102. The base substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 102 may be about, but is not limited to, several hundred microns thick. For example, the base substrate 102 may include a thickness ranging from 0.5 mm to about 1.5 mm.

The buried dielectric layer 104 may be formed from any of several known dielectric materials. Non-limiting examples include oxides, nitrides and oxynitrides of silicon. Oxides, nitrides and oxynitrides of other elements are also envisioned. In addition, the buried dielectric layer 104 may include crystalline or non-crystalline dielectric material. Moreover, the buried dielectric layer 104 may be formed using any of several known methods. Non-limiting examples include ion implantation methods, thermal or plasma oxidation or nitridation methods, chemical vapor deposition methods and physical vapor deposition methods. In an embodiment, the buried dielectric layer 104 may be about 150 nm thick. Alternatively, the buried dielectric layer 104 may include a thickness ranging from about 10 nm to about 500 nm.

The SOI layer (not shown) may include any of the several semiconductor materials included in the base substrate 102. In general, the base substrate 102 and the SOI layer may include either identical or different semiconducting materials with respect to chemical composition, dopant concentration and crystallographic orientation. In an embodiment, the base substrate 102 and the SOI layer may include semiconducting materials that include at least different crystallographic orientations. Typically the base substrate 102 or the SOI layer include a $\{110\}$ crystallographic orientation and the other of the base substrate 102 or the SOI layer includes a $\{100\}$ crystallographic orientation. Typically, the SOI layer includes a thickness ranging from about 5 nm to about 100 nm. Methods for forming the SOI layer are well known in the art. Non-limiting examples include SIMOX (Separation by Implantation of Oxygen), wafer bonding, and ELTRAN® (Epitaxial Layer TRANsfer).

The fins 115 may be etched from the SOI substrate using typical photolithography and etch techniques. The fins 115 may be primarily formed from the SOI layer (not shown) of the SOI substrate. In an embodiment, the fins 115 may have a height of approximately 20 nm. In an embodiment, the fins 115 may include multiple layers in addition to the SOI layer (not shown) of the SOI substrate. For example, an oxide layer (not shown) and a nitride layer (not shown) may be formed on a top surface of the SOI layer, where the nitride layer may be located directly on top of the oxide layer.

The gate stack 107 may include a gate dielectric 108, a metal gate 110, and a gate cap 112. In an embodiment, the gate dielectric 108 may be formed after removal of a dummy gate during a replacement gate process flow. The gate dielectric 108 can be formed by any deposition technique known in the art, such as, for example, chemical vapor deposition (CVD), plasma-assisted CVD, atomic layer deposition (ALD), evaporation, reactive sputtering, chemical solution deposition or other like deposition processes. The gate dielectric 108 may also be formed using any combination of the above processes.

The gate dielectric 108 may include an insulating material including, but not limited to: oxide, nitride, oxynitride or silicate including metal silicates and nitrided metal silicates. In one embodiment, the gate dielectric 108 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric 108 may vary, but typically may have a thickness ranging from about 0.5 nm to about 10 nm. More preferably the gate dielectric 108 may have a thickness ranging from about 0.5 nm to about 3 nm.

The metal gate 110 may be formed on top of the gate dielectric 108. The metal gate 110 may be deposited by any suitable technique known in the art, for example by atomic layer deposition (ALD), chemical vapor deposition (CVD), physical vapor deposition (PVD), molecular beam deposition (MBD), pulsed laser deposition (PLD), or liquid source misted chemical deposition (LSMCD). The metal gate 110 may include, for example, Si, a-Si, Zr, W, Ta, Hf, Ti, Al, Ru, Pa, metal oxide, metal carbide, metal nitride, transition metal aluminides (e.g. Ti3Al, ZrAl), TaC, TiC, TaMgC), and any combination of those materials. In an embodiment, the metal gate 110 may include tungsten.

The gate cap 112 may be formed on top of the metal gate 110 using any suitable deposition technique known in the art. The gate cap 112 typically is an insulator and may include, for example, Ni, $SiO_2$, and SiC.

Each fin 115 may be separated from an adjacent fin 115 via a trench region 208 having a top portion 208A and a bottom portion 208B. For illustrative purposes dashed lines are used in the figures to delineate approximate boundaries of a given trench region 208 and its corresponding top portion 208A and bottom portion 208B. The top portion 208A and the bottom portion 208B are so labeled for ease of reference in describing further fabrication steps according to embodiments of the present disclosure, and do not necessarily denote separate structures or separate components of the same structure. Furthermore, the top portion 208A and the bottom portion 208B are not necessarily drawn to scale.

While only two trench regions 208 are labeled in FIG. 1A, it shall be understood by a person of ordinary skill in the art that there may be additional trench regions in the finFET 100, which are not labeled as such, so as to maintain clarity.

In an embodiment, a trench region 208 may be defined by at least two sidewalls. For example, the at least two sidewalls may correspond to opposite facing sidewalls of two adjacent fins 115. Alternatively, the at least two sidewalls may correspond to a sidewall of a fin 115 and an adjacent sidewall of a corresponding gate stack 107.

In an embodiment, the trench region 208 may be defined by at least three sidewalls. For example, the three sidewalls may correspond to opposite facing sidewalls of two adjacent fins 115 and an adjacent sidewall of a corresponding gate stack 107 formed over the two adjacent fins 115. Alternatively, the three sidewalls may correspond to opposite facing sidewalls of two adjacent gate stacks 107 and an adjacent sidewall of a corresponding fin 115 over which the two adjacent gate stacks 107 are formed.

In an embodiment, the given trench region 208 may be defined by at least four sidewalls. For example the four sidewalls may correspond to opposite facing sidewalls of two adjacent fins and corresponding opposite facing sidewalls of two adjacent gate stacks 107 formed over the two adjacent fins 115.

The above-described trench regions 208 having at least two, three, or four sidewalls, are more clearly depicted in FIG. 1D, below, wherein the finFET 100 is depicted from a top view.

The trench region 208 may be above the buried dielectric layer 104, although one or more other layers (not shown) may separate the trench region 208 from the dielectric layer 104.

In one embodiment, the width of the trench region 208 may correspond to a distance between two adjacent fins 115, and may be, in one example, approximately 30 nm. The length of the trench region 208 may correspond to a distance between two adjacent gate stacks 107. In an embodiment, the bottom portion 208B of the trench region 208 may have a height of approximately 5-6 nm. The top portion 208B may have a thickness of approximately 14-15 nm where the trench region 208 as a whole has a height of 20 nm (the sum of the heights of the bottom portion 208B and the top portion 208A corresponding to the height of one fin 115, in this example).

With continued reference to FIG. 1A, while the fins 115 are shown as extending to an edge of the SOI substrate (including the buried dielectric layer 104), and while the gate stack 107 is depicted as not extending to an edge of the SOI substrate, these depictions are for illustrative purposes only and should not be construed as a requirement. Furthermore, a given fin 115, or a given gate stack 107, may have a different length than that of one or more other fins 115 or one or more other gate stacks 107. Additionally, it should be noted that the trench regions 208 need not be the same size.

Figure 1B:
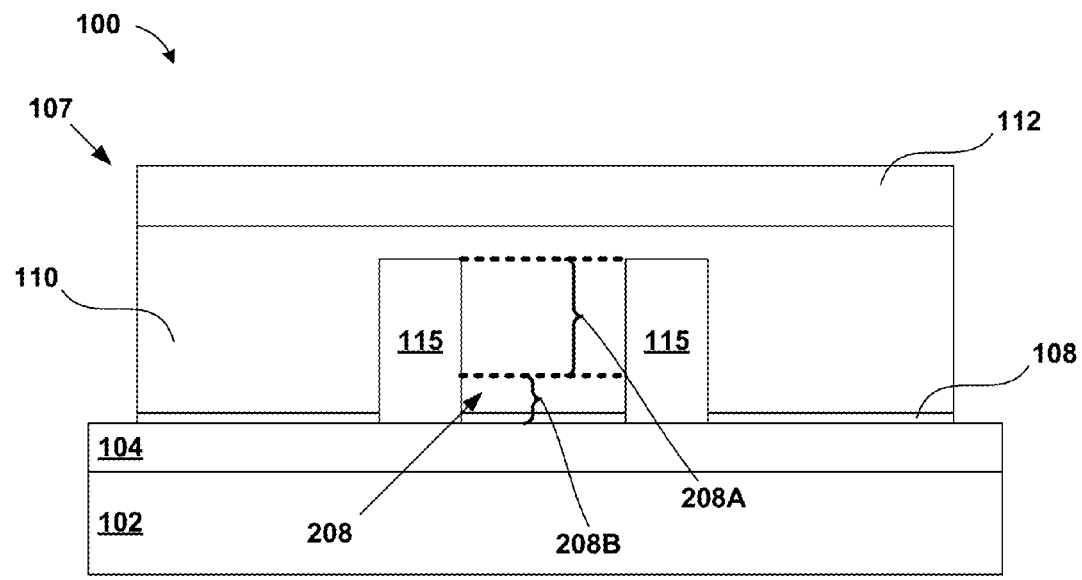
FIG. 1B depicts a front view of the finFET of FIG. 1A, according to an embodiment of the present disclosure.

Referring now to FIG. 1B, a front view of the finFET 100 in FIG. 1A is shown. In the front view, only the base substrate 102, the buried dielectric layer 104, two fins 115 (made in the SOI layer (not shown)), one gate stack 107 (including a gate dielectric 108, a gate metal 110, and a gate cap 112), and at least one trench region 208 having a top portion 208A and a bottom portion 208B, are visible.

Figure 1C:
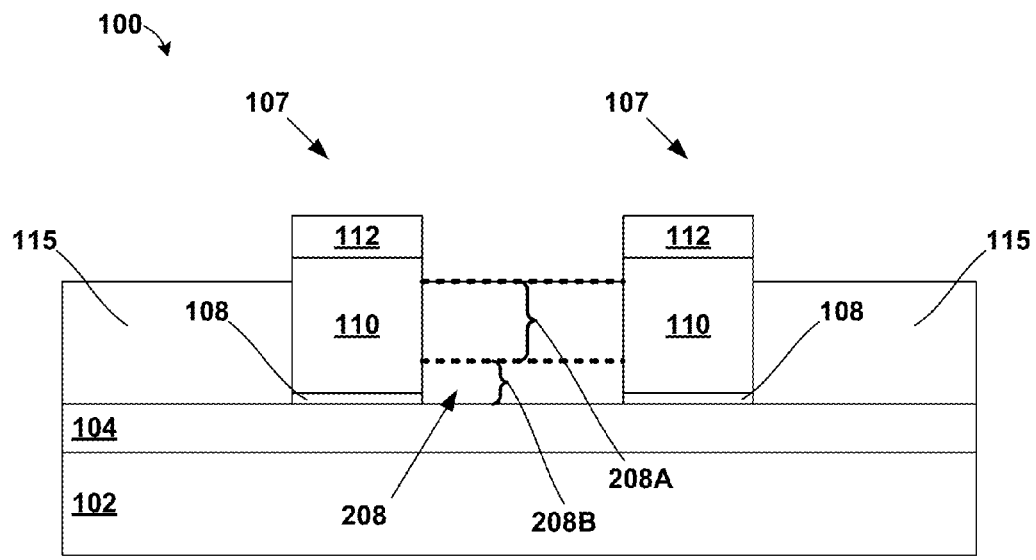
FIG. 1C depicts a side view of the finFET of FIG. 1A, according to an embodiment of the present disclosure.

Referring now to FIG. 1C, a side view of the finFET 100 of FIG. 1A is shown. In the side view, only the base substrate 102, the buried dielectric layer 104, one fin 115, at least one trench region 208 and its corresponding top portion 208A and bottom portion 208B, two gate stacks 107, including corresponding gate dielectrics 108, gate metals 110, and gate caps 112, are visible.

Figure 1D:
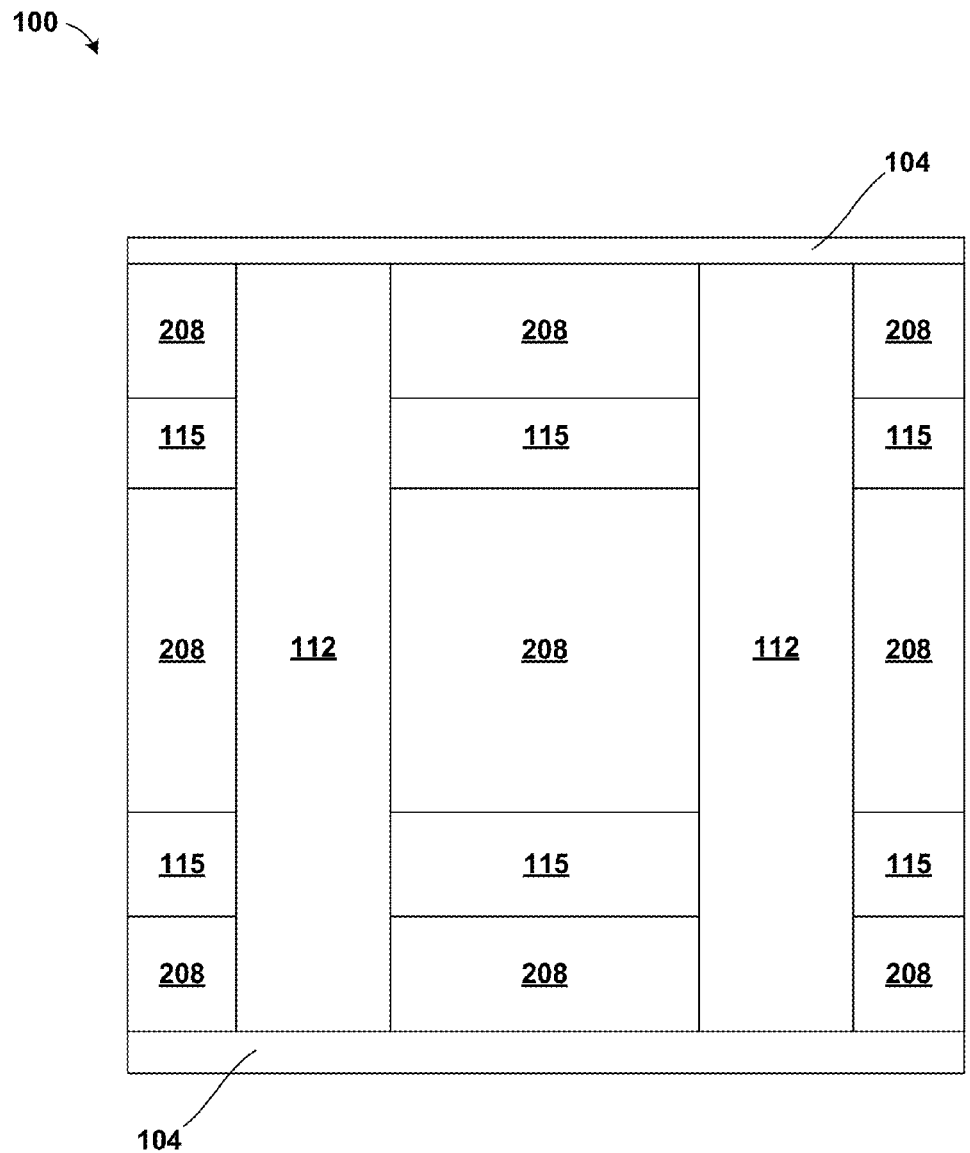
FIG. 1D depicts a top view of the finFET of FIG. 1A, according to an embodiment of the present disclosure.

Referring now to FIG. 1D, a top view of the finFET 100 of FIG. 1A is shown. In the top view, only the buried dielectric layer 104, two gate caps 112, two fins 115, and eight trench regions 208 are shown.

Figure 2A:
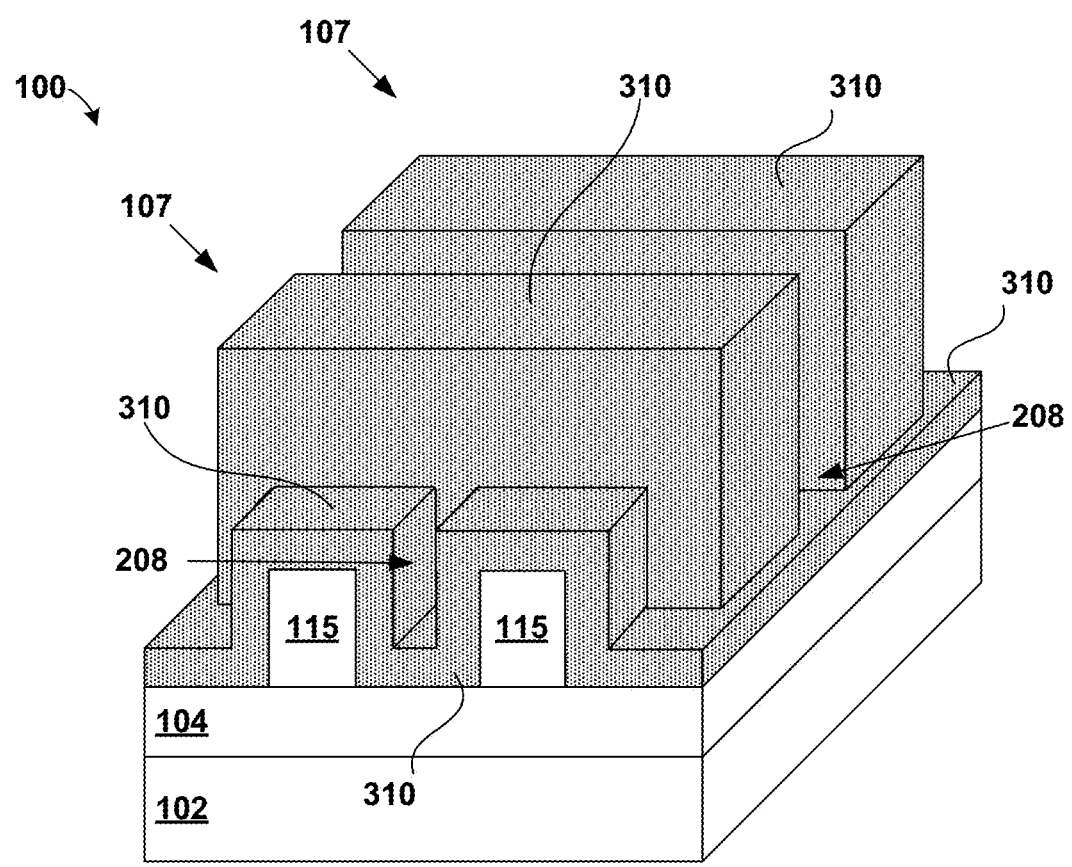
FIG. 2A depicts an isometric view of a protective layer on the finFET of FIG. 1A, according to an embodiment of the present disclosure.

Referring now to FIG. 2A, an isometric view of a protective layer 310 on the finFET 100 of FIG. 1A is shown, according to an embodiment. The protective layer 310 may be made of any material suitable for insulating the fins 115 and/or the buried dielectric layer 104, or other components of the structure 100, during subsequent fabrication processes. This may include, for example, insulating the buried dielectric layer 104 at the bottom of the trench region(s) 208 during epitaxy pre-clean processes, such that the buried dielectric layer 104 is not etched during such a process.

In an embodiment, the protective layer 310 may be made of a material selected from a group including oxides, nitrides, oxynitrides, carbon-doped oxides, carbon-doped nitrides, and carbon-doped oxynitrides. Additionally, the protective layer 310 may be made from silicon-nitride.

The protective layer 310 may be formed on the finFET 100 using any known method in the art, including, for example, masked deposition. The protective layer 310, when deposited on the finFET 100, may have a thickness of approximately 5-10 nm.

The material and method of deposition of the protective layer 310 may be such that the protective layer 310 conforms to the topography of the finFET 100 and covers some or substantially all of a top surface of the finFET 100. More specifically, the protective layer 310 may form over the trench region(s) 208 (of which at least two are labeled in FIG. 2A) such that some or all of the trench region(s) 208, including some or all of their corresponding top portion 208A (not labeled in FIG. 2A) and bottom portion 208B (not labeled in FIG. 2A), are filled with the protective layer 310. The protective layer 310 may also cover a top surface of the gates stacks 107 including, for example, the gate caps 112, and sidewalls of the gate stacks 107.

In an embodiment where at least two finFETs 100 are formed on the SOI substrate (including the buried dielectric layer 104), where the first finFET is an n-doped finFET (NFET) and the second finFET is a p-doped finFET (PFET), the protective layer 310 may include different materials or different thicknesses for the NFET device(s) and the PFET device(s). For example, in one step, any known masking technique may be used to deposit the protective layer 310 using a first material having a first thickness over one or more NFETs. In another step, the same may be done with respect to one or more PFETs using a second material at a second thickness. The first material and the first thickness may be the same as, or different from, the second material and the second thickness, respectively.

Figure 2B:
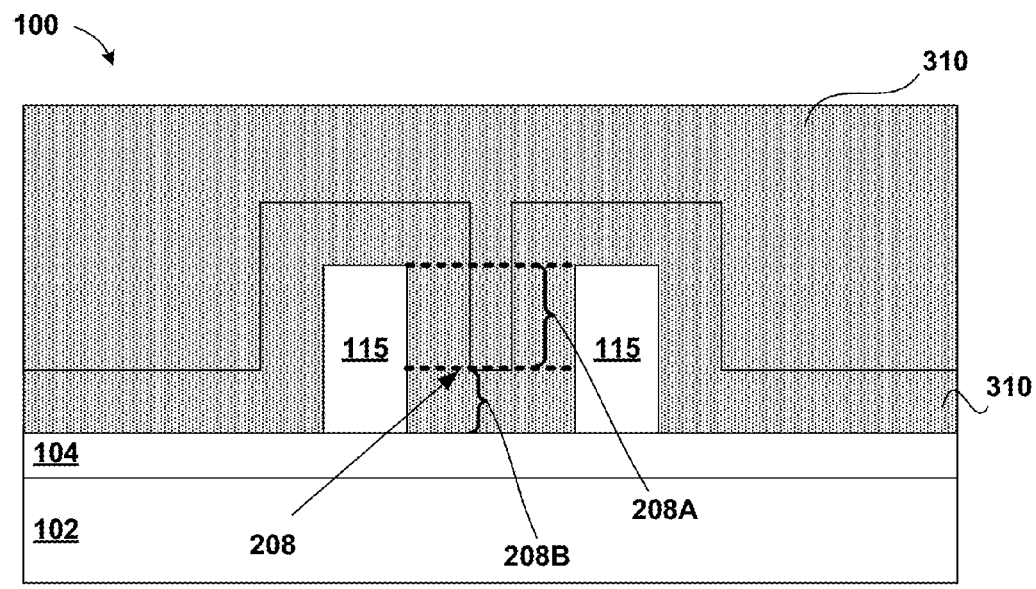
FIG. 2B depicts a front view of the finFET of FIG. 2A, according to an embodiment of the present disclosure.

Referring now to FIG. 2B, a front view of the finFET 100 of FIG. 2A is shown. In the front view, only the base substrate 102, the buried dielectric layer 104, two fins 115 formed in the SOI layer (not shown), at least one trench region 208 having a top portion 208A and a bottom portion 208B, and the protective layer 310 covering the fins 115 and covering the gate stack 107 (the gate stack 107 is not shown in FIG. 2B), are visible.

Figure 2C:
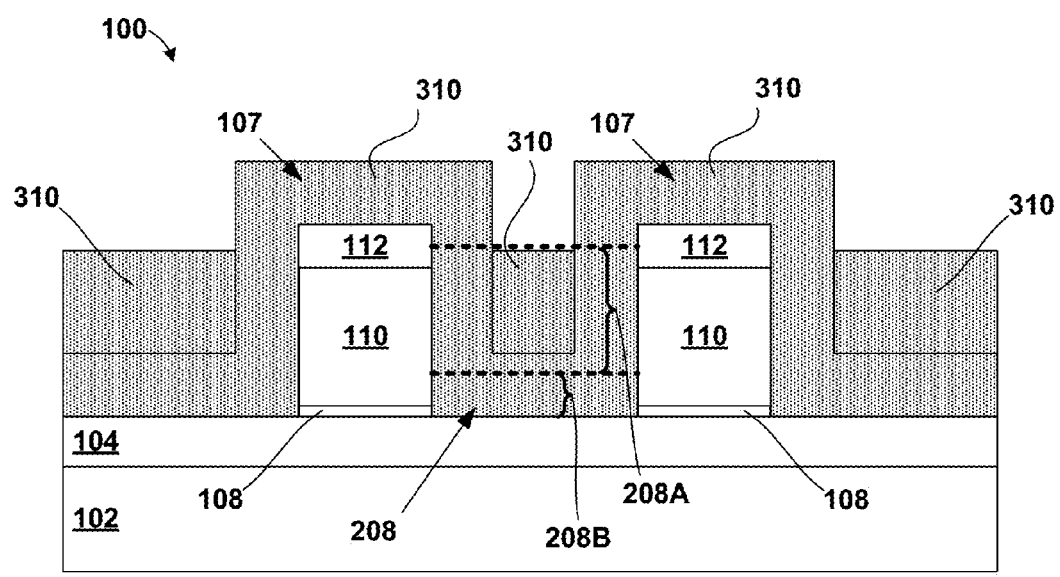
FIG. 2C depicts a side view of the finFET of FIG. 2A, according to an embodiment of the present disclosure.

Referring now to FIG. 2C, a side view of the finFET 100 of FIG. 2A is shown. In the side view, only the base substrate 102, the buried dielectric layer 104, at least one trench region 208 having a top portion 208A and a bottom portion 208B, two gate stacks 107 (including the gate dielectrics 108, the gate metals 110, and the gate caps 112), and the protective layer 310, are shown. The protective layer 310 covers at least one fin 115, although the fin 115 itself is not visible in this view.

Figure 2D:
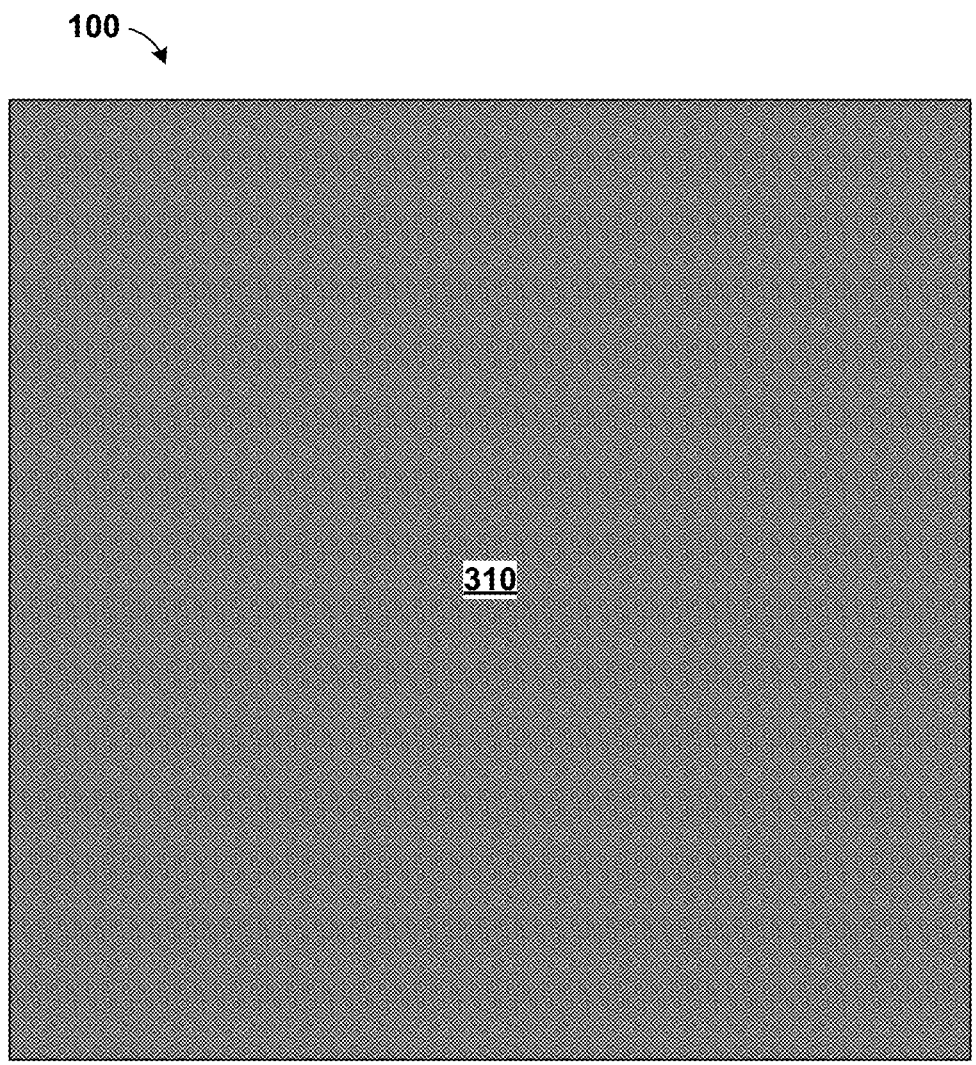
FIG. 2D depicts a top view of the finFET of FIG. 2A, according to an embodiment of the present disclosure.

Referring now to FIG. 2D, a top view of the finFET 100 of FIG. 2A is shown. In the top view, only the protective layer 310 is shown. The protective layer 310 may cover all or part of a top surface of the finFET 100 shown in FIG. 2A, including, for example parts or all of the buried dielectric layer 104, the fins 115, the gate stacks 107, and the trench regions 208 shown in FIG. 2A.

Figure 3A:
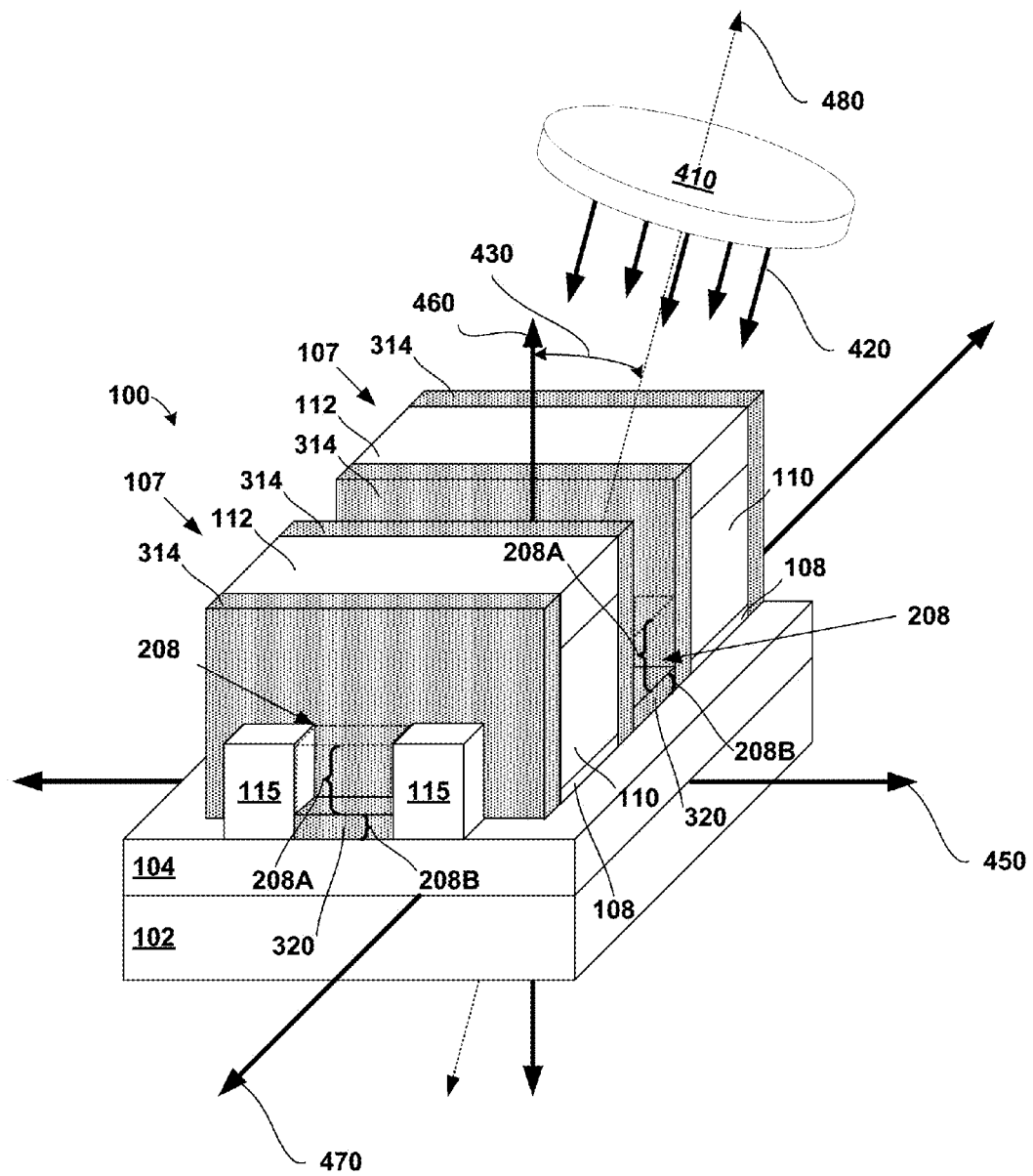
FIG. 3A depicts an isometric view of portions of the protective layer removed from the finFET of FIG. 2A using an ion beam, according to an embodiment of the present disclosure.

Referring now to FIG. 3A, an isometric view of the finFET 100 of FIG. 2A is shown where portions of the protective layer 310 are removed using an ion beam 420 emitted by an ion beam source 410, according to an embodiment. In this view, the finFET 100, the ion beam source 410, their respective components, and at least four axes are shown.

The finFET 100 includes, in this view, the base substrate 102, the buried dielectric layer 104, two fins 115 formed in the SOI layer (not shown), at least two trench regions 208 having corresponding top portions 208A and bottom portions 208B, and two gate stacks 107 (including gate dielectrics 108, gate metals 110, and gate caps 112). Additional trench regions are not labeled to maintain clarity of the figure (FIG. 2D, below, depicts additional trench regions 208, according to an embodiment). Each gate stack 107 is flanked by a pair of gate spacers 314. A protective trench layer 320 is present on the bottom portion 208B of each trench region 208. Each gate spacer 314, and each protective trench layer 320, is formed upon removal of portions of the protective layer 310 from the finFET 100, as described in greater detail below.

In this view, the finFET 100 is positioned along an x-axis 450, a y-axis 460, and a z-axis 470 (collectively, the "xyz axes"), where each of the xyz axes is substantially perpendicular to the finFET 100 in the x, y, and z directions, respectively. To facilitate ease of reference, the side of the finFET 100 facing the right side of the figure may be referred to as the front side of the finFET 100, whereas the side of the finFET 100 facing the left side of the figure may be referred to as the back side of the finFET 100.

The ion beam source 410 may be an ion beam generating device, described in greater detail in connection with FIGS. 4-5, below. The ion beam 420 emitted by the ion beam source 410 may remove portions of the protective layer 310 (shown in FIG. 2A), and to form the gate spacers 314 and the protective trench layer 320, as described below. The ion beam source 410 may be, in an embodiment, an ion beam milling device, as described in connection with FIG. 4, below. In another embodiment, the ion beam source 410 may be a gas cluster ion beam (GCIB) device, as described in connection with FIG. 5, below.

In an embodiment, the ion beam source 410 may be positioned on the front side of the finFET 100 along at least a fourth axis 480, where the fourth axis 480 is defined such that it intercepts the ion beam source 410 at a substantially perpendicular angle. In an embodiment, the fourth axis 480 is defined on a plane along the x-axis 450 and the y-axis 460. In an embodiment, an oblique angle 430 between the y-axis 460 and the fourth axis 480 may have a measure ranging from approximately 30 degrees to approximately 60 degrees. Factors that may determine a desired measure of the oblique angle 430 vary based on particular embodiments. Exemplary and non-limiting factors may include fin 115 height, trench 208 height (if different from fin 115 height), trench 208 width, thickness of the protective layer 310 prior to application of the ion beam 420, and the desired thickness of the protective trench layer 320 subsequent to removal of the protective layer 310 using the ion beam 420.

In an embodiment, the fourth axis 480 may be defined along a different plane than that described above. For example, the fourth axis may be along a plane defined by the y-axis 460 and the z-axis 480. Furthermore, in an embodiment, the ion beam source 410 may be positioned along a fifth axis (not shown) on a plane between the y-axis 460 and the x-axis 450 in an opposite direction from the fourth axis 480 (for example, on the back side of the finFET 100). In an embodiment, the direction at which the fourth axis 480 is positioned may be clockwise relative to the y-axis 460, and the direction at which the fifth axes (not shown) is positioned may be counterclockwise relative to the y-axis 460. A second oblique angle (not shown) may be between, for example, the y-axis 460 and the fifth axis, and may have a measure equal to that of the oblique angle 430, but may have an inverse sign. In other words, the ion beam source 410 may be positioned in such a way that the ion beam 420 may be directed at the finFET 100 from one side, and then again from an opposite side, to remove portions of the protective layer 310.

According to an embodiment, the ion beam 420 may be directed at the finFET 100 at any oblique angle at least once during the fabrication process, and at least once in an opposite direction, although the fabrication process may include deposition or etching of material onto/from the finFET 100 using substantially perpendicular removal techniques. Therefore, measurement of the oblique angle 430 is not limited to the form described above. For example, the oblique angle 430 may be measured from the x-axis 450 to the fourth axis 480.

The ion beam 420, generated by the ion beam source 410, may be used to remove portions of the protective layer 310 from the finFET 100. In particular, treatment of the finFET 100 by directing the ion beam 420 at the oblique angle 430 may allow for a controlled removal of portions of the protective layer 310 from surfaces of the finFET 100. For example, the ion beam 420 may remove portions of the protective layer 310 from a top surface of each gate stack 107, a top surface of each fin 115, and a top surface of the buried dielectric layer 104. Additionally, the ion beam 420 may remove portions of the protective layer 310 from the top portion 208A of the trench region(s) 208, without removing the protective layer 310 from the corresponding bottom portion 208B. The layer remaining in the bottom portion 208B of the trench region(s) 208 may be referred to as a protective trench layer 320. Additionally, the removal process may leave in place much of or substantially all of the protective layer 310 on sidewalls of the gate stacks 107, such that the resulting finFET 100 includes pairs of spacers formed on either side of each gate stack 107. The spacers on the sides of the gate stacks 107 may be referred to as gate spacers 314. The protective trench layer 320 may, but need not be, substantially planar.

In an embodiment, subsequent to forming the protective layer 310 (as shown in FIG. 2A) but prior to removing the protective layer 310 using the ion beam source 410 (as shown in FIG. 3A), portions of the finFET 100 may be planarized such that the gate caps 112 are exposed.

Although the protective trench layer 320 is described separately from the spacer(s) 314, and is depicted as a separate component in FIG. 3A, this distinction is for illustrative purposes only, and should not be construed as a requirement. Instead, these references are intended to identify portions of the protective layer 310 (see FIG. 2A) subsequent to removal using the ion beam 420. For example, in an embodiment, the material forming the protective layer 302 and the spacers 314 may be substantially continuous (except, for example, for manufacturing flaws).

The removal process of the protective layer 310 may include, in one example, directing the ion beam 420 at the finFET 100 at the oblique angle 430, where the oblique angle 430 may range from approximately 30 degrees to approximately 60 degrees. The length of time for which this step may be performed depends, in part, on the material of the protective layer 310, the composition of the ion beam 420, and a desired thickness of the protective trench layer 320 in the bottom portion 208B of the trench region(s) 208. For example, the length of time may vary from 1 second to 5 minutes, but may be shorter or longer.

In another step, the ion beam 420 may be directed at the finFET 100 at a second oblique angle (not shown) whose measure is inverse but equal in magnitude to the measure of the oblique angle 430. The measure of the inverse angle need not be equal to that of the oblique angle 430. Additional portions of the protective layer 310 may be removed further during this step to attain a desired shape and thickness.

In an embodiment, removing the protective layer 310 from the finFET 100 using the ion beam 420 may be performed subsequent to one or more conventional etching processes, including, for example, blanket wet or dry etching processes, which may, for example, remove portions of the protective layer 310 from the finFET 100 at a substantially perpendicular angle relative to the base substrate 102, and in a substantially planar manner. Thereafter, the oblique-angular treatment of the finFET 100 using the ion beam 420 may be performed as described above.

In another embodiment, where two or more finFETs 100 are present on a semiconductor wafer, where at least one such finFET is an NFET device and at least another such finFET is a PFET device, the removal process may include applying the ion beam 420 to the two or more finFETs 100 during one step to remove the protective layer 310 from top portions 208A of trench regions 208 of the NFETs, and removing the protective layer 310 in another step from top portions 208A of trench regions 208 of the PFETs. Alternatively, these steps may be performed in reverse order. A masking process using lithography may be used to mask either NFETs or PFETs as needed, depending on the mask design.

Figure 3B:
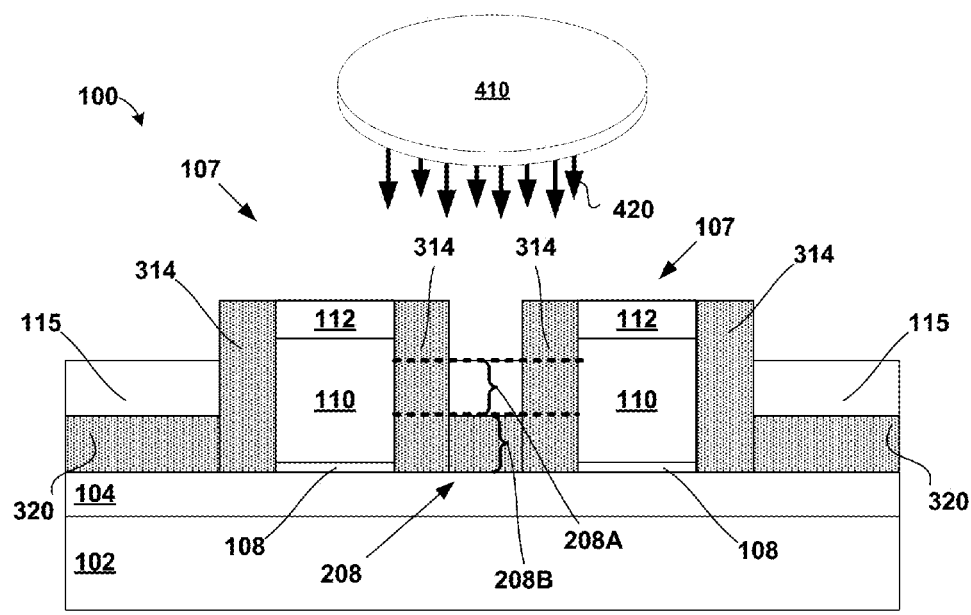
FIG. 3B depicts a front view of portions of the protective layer removed from the finFET of FIG. 2A using an ion beam, according to an embodiment of the present disclosure.

Referring now to FIG. 3B, a front view of the finFET 100 and the ion beam source 410 of FIG. 3A are shown, according to an embodiment. The finFET 100 includes the base substrate 102, the buried dielectric layer 104, two gate stacks 107 (including gate dielectrics 108, gate metals 110, and gate caps 112), one fin 115, at least one trench region 208 having a corresponding top portion 208A and bottom portion 208B, as well as the protective trench layer 320 formed on the bottom portion 208B of the at least one trench region 208, and the gate spacers 314 surrounding the gate stacks 107, are visible.

Additionally, the ion beam source 410 and the ion beam 420 are depicted, wherein the ion beam 420 is directed at the finFET 100 from the front side of the finFET 100 towards the back side of the finFET 100. The xyz axes and the fourth and fifth axes (FIG. 3A) are not shown in this view.

As described above, the protective trench layer 320 is on a bottom portion 208B of the trench region(s) 208, whereas a top portion 208A of the trench region(s) 208 is substantially free of the protective layer 310 except for the gate spacers 314 on sidewalls of the gate stacks 107.

Figure 3C:
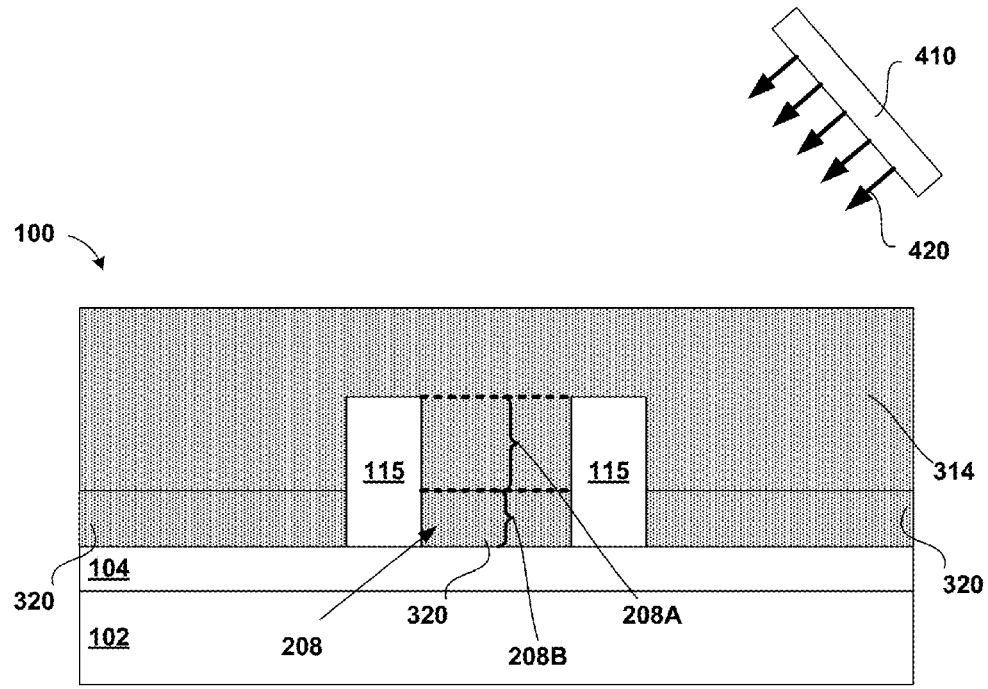
FIG. 3C depicts a side view of portions of the protective layer removed from the finFET of FIG. 2A using an ion beam, according to an embodiment of the present disclosure.

Referring now to FIG. 3C, a side view of the finFET 100 and the ion beam source 410 of FIG. 3A are shown, according to an embodiment. In this view, the finFET 100 includes the base substrate 102, the buried dielectric layer 104, two fins 115, at least one trench region 208 having a corresponding top portion 208A and bottom portion 208B, the protective trench layer 320, and one gate spacer 314 formed on a sidewall of a gate stack 107 (not shown).

Additionally, in this view, the ion beam source 410 and the ion beam 420, positioned on the front side of, and facing the back side of, the finFET 100, are visible.

The protective trench layer 320 is on the bottom portion 208B of the trench region(s) 208, whereas the top portion 208A of the trench region 208 is substantially free of the protective layer 310, except for the gate spacer 314 on a sidewall of the gate stack 107 (the gate stack 107 is not shown in this view).

Figure 3D:
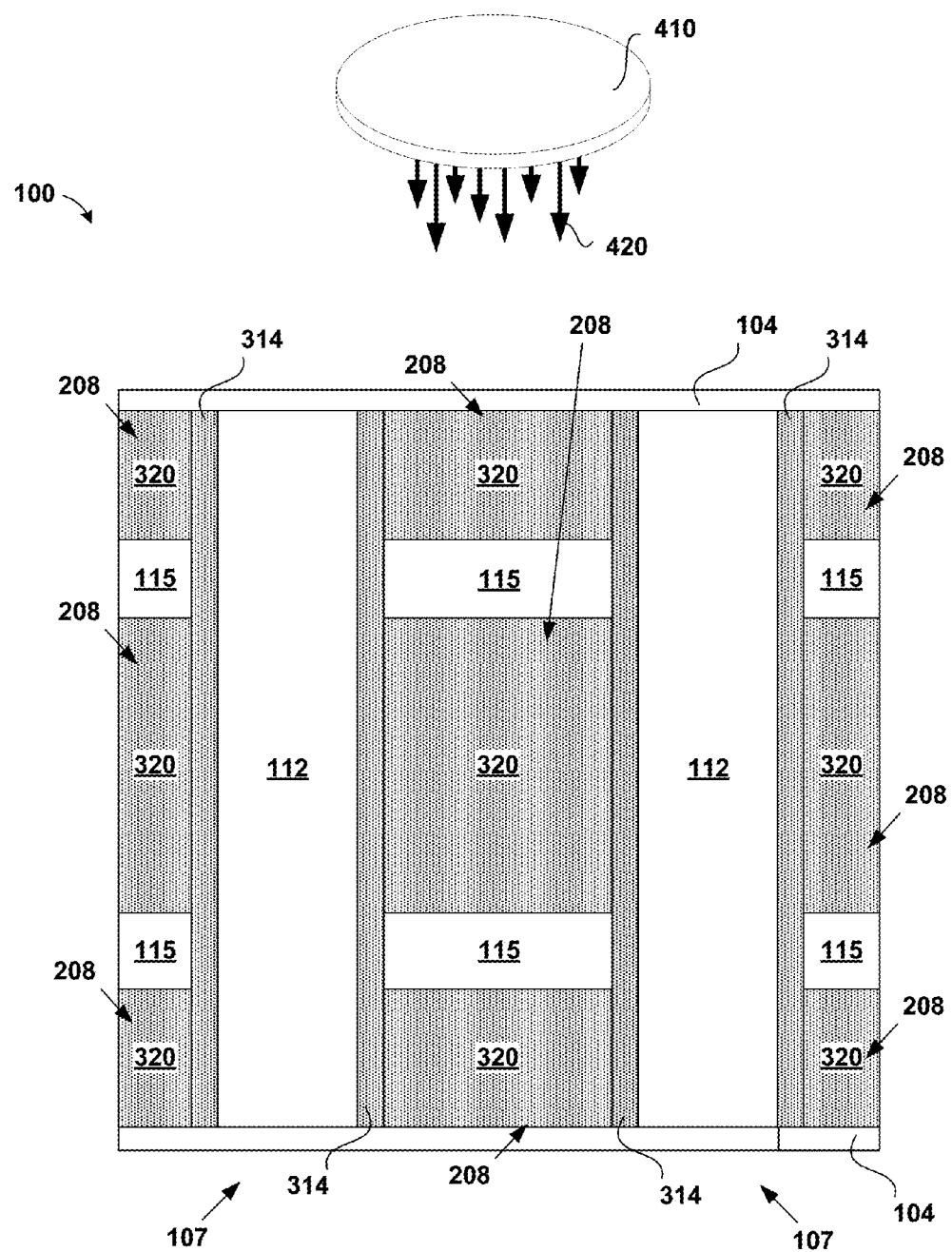
FIG. 3D depicts a top view of portions of the protective layer removed from the finFET of FIG. 2A using an ion beam, according to an embodiment of the present disclosure.

Referring now to FIG. 3D, a top view of the finFET 100 and the ion beam source 410 of FIG. 3A are shown, according to an embodiment. With respect to the finFET 100, the buried dielectric layer 104, two fins 115, two gate caps 112 of two corresponding gate stacks 107, and two pairs of gate spacers 314 each surrounding one of the two gate stacks 107, and eight trench regions 208 are visible. The protective layer 310 is present on a bottom portion 208B of each trench region 208 (not shown) but is removed from a corresponding top portion 208A except for the gate spacers 314 on sidewalls of the gate stacks 107. The portion of the protective layer 310 that is present in the bottom portion 208B of each trench region 208 is labeled as the protective trench layer 320.

Additionally, the protective layer 310 is removed from other surfaces of the structure 100, including top portions of the gate stack(s) 107, including the gate cap 112. In an embodiment, the protective layer 310 may be removed from over portions of the buried dielectric layer 104.

Figure 4:
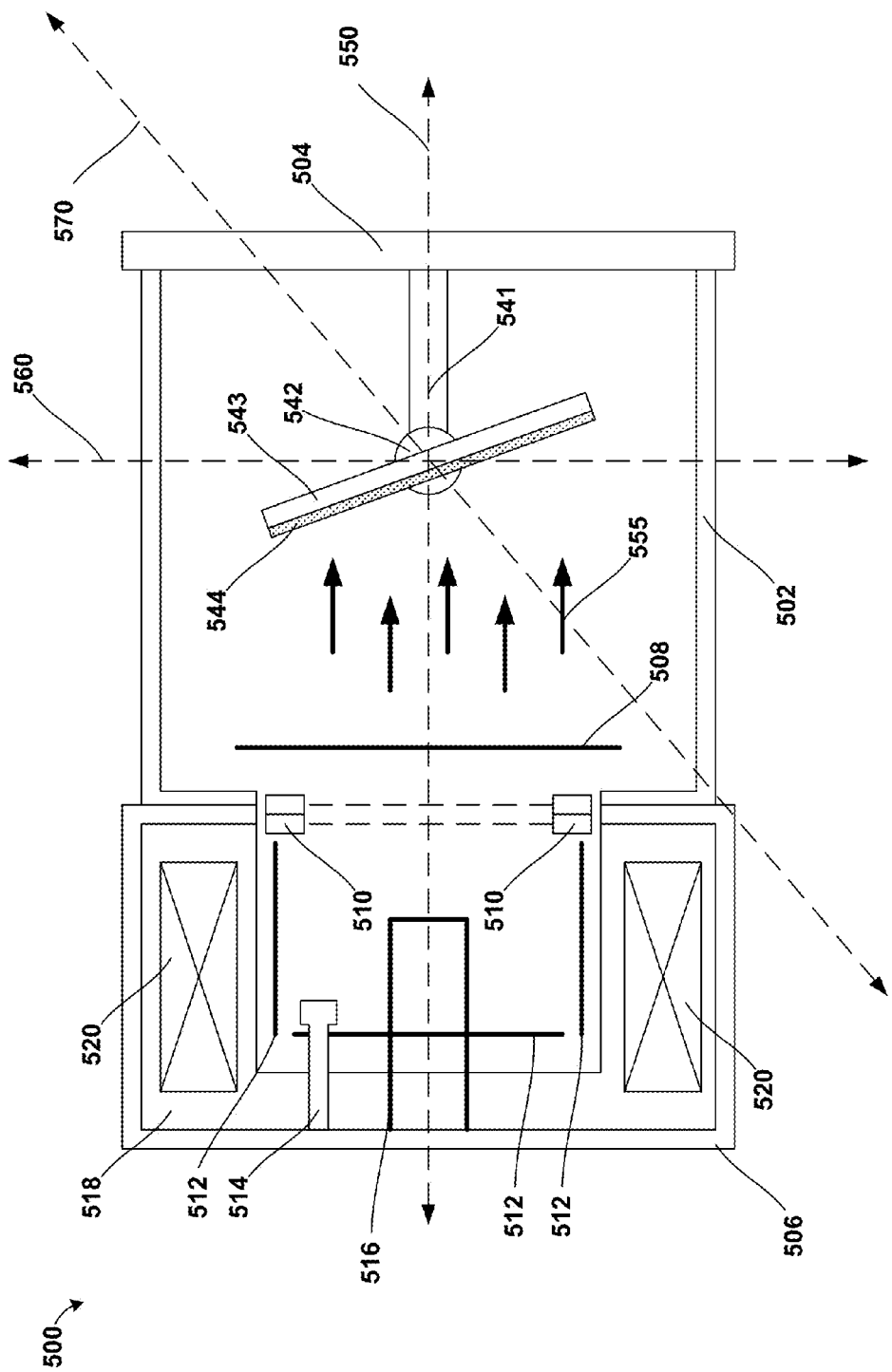
FIG. 4 depicts the angular ion beam milling device, according to an embodiment of the present disclosure.

FIG. 4 depicts an angular ion beam milling device 500 for removing portions of the protective layer 310 from the finFET 100 of FIG. 2A, according to an embodiment. The ion beam milling device 500 may correspond, for example, to the ion beam source 410 shown in FIG. 3A. The ion beam milling device 500 may be configured to include a platen 543 mounted on a mechanical rotating/swiveling joint 542 affixed to a stand 541. The stand 541 may be affixed, for example, to a surface of a work chamber 502. The work chamber 502 may have a chamber door 504 through which the work chamber 502 may be accessed. A substrate 544, such as a semiconductor wafer on which the finFET 100 of FIGS. 1-2D may be formed, may be placed on the platen 543. The platen 543 may be positioned by movement and/or rotation about a first horizontal x-axis 550, a vertical y-axis 560, and/or a second horizontal z-axis 570 (collectively, "xyz axes") using, for example, the pivoting joint 542. For example, the platen 542 may be positioned along the xyz axes such that a top surface of the substrate 544 is at an oblique angle as measured between the x-axis 550 and the y-axis 560. The platen 543 may keep the substrate 544 at a relatively low temperature to facilitate the milling process.

The ion beam milling device 500 may include a beam source component 506 that generates an ion beam 555 and directs the ion beam towards the work chamber 502, such that the ion beam 555 may be intercepted by the substrate 544. The beam source component 506 may include the following elements: one or more anodes 512; a heated cathode 516; a baffled gas inlet 514; a discard chamber 518; solenoids 520; optically aligned grids 510; and a neutralization filament 508.

In one embodiment, the ion beam 555 may be formed using argon gas ions. As the argon ions intercept the substrate 544 at an angle while the substrate rotates, it is possible to achieve uniform removal of waste material, resulting in straight side walls in all features of the substrate 544 with zero undercutting.

This may be achieved by ionizing the argon gas, provided through the baffled inlet 514. The argon gas may be ionized using the solenoids 520. The ionized argon gas, formed by an electrical discharge confined to the discharge source chamber 506, may be accelerated by using the pair of optically aligned grids 510, and directed towards the substrate 544. Before the ion beam 555 intercepts the substrate 544, it may travel through a neutralization filament 508 such that the ion beam 555 is fully neutralized, having an energy of 300 eV to 1000 eV.

The particles in the ion beam 555 bombard the substrate 544 and remove material from substrate 544 surface. The beam 555 may be collimated, and have a diameter of 10-15 inches where it is intercepted by the substrate 544.

Prior to application of the ion beam 555, a photo sensitive resist layer ("photoresist") may be applied to the substrate 544 to protect underlying material during the application process. In some embodiments, the ion beam 555 may etch substantially all material that is exposed to the beam 555, including the photoresist layer. However, since the photoresist's etch rate is typically lower than that of the material being removed from the surface of the substrate 544 (e.g., the protective layer 310 shown in FIG. 2A), the metallization that defines the circuitry on the substrate 544 remains. Different photoresists can be used to accommodate the particular application of the ion beam milling device 500.

Using the ion beam milling device 500, it is possible to treat the surface of the substrate 544 including, for example, finFET devices such as the finFET 100 (FIGS. 1A-3D). The ion beam milling device 500 may be used, for example, to remove portions of the protective layer 310 once it has been deposited, independently of the method of deposition. More particularly, the ion beam milling device 500 may be used to remove portions of the protective layer 310 from the top portion 208A (not shown) of trench regions 208 (not shown) of the finFET 100 (not shown), while leaving a protective trench layer 320 (not shown) on a bottom portion 208B (not shown) of the trench region.

Figure 5:
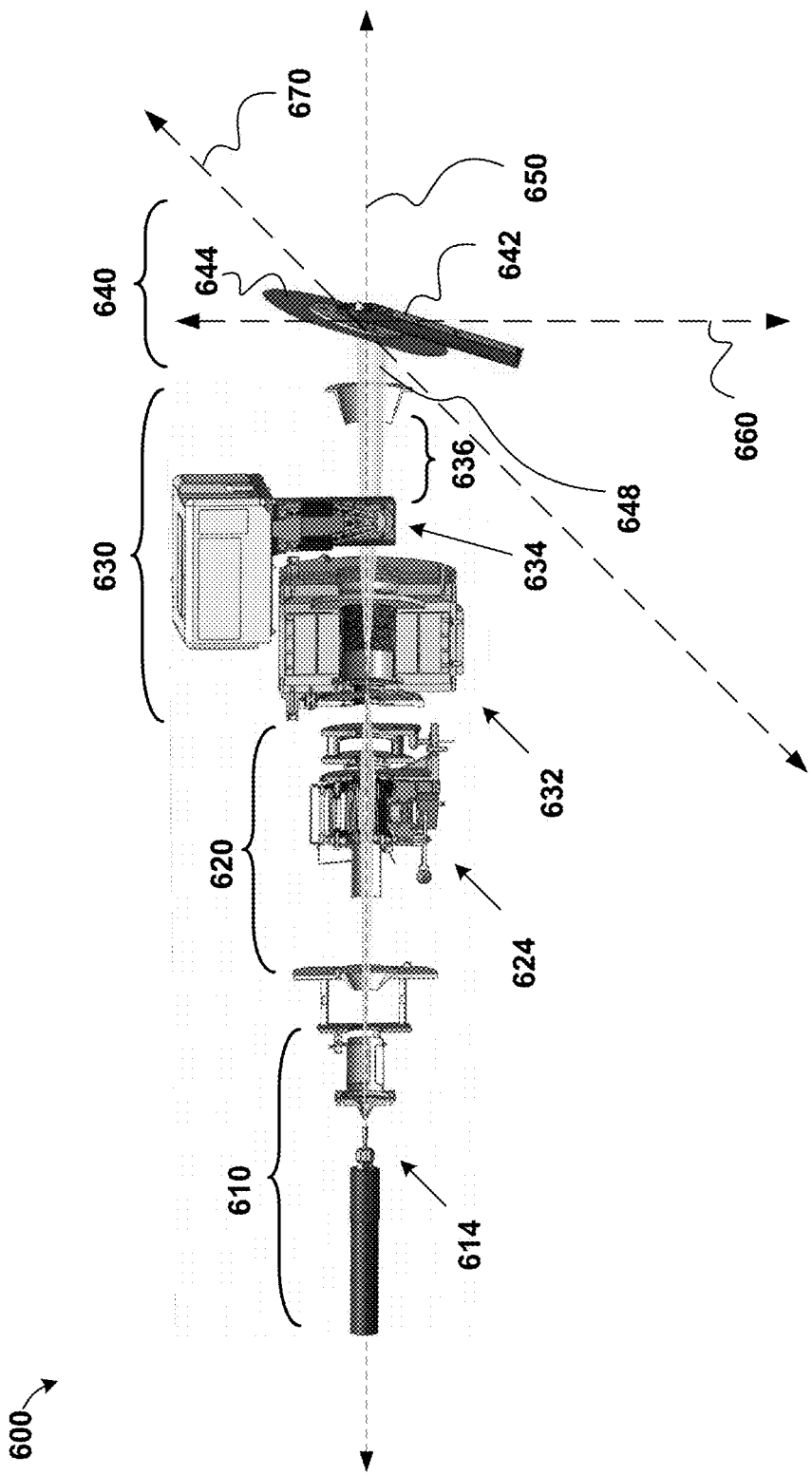
FIG. 5 depicts the angular gas cluster ion beam device, according to an embodiment of the present disclosure.

FIG. 5 depicts an angular gas cluster ion beam (GCIB) system 600 for removing portions of the protective layer 310 from the finFET 100 of FIG. 2A, according to an embodiment.

A gas cluster ion beam ("GCIB") system 600 according to an embodiment, comprises a multi-part cluster formation module 610 (generically referred to herein as a first module 610), including a nozzle 614 emitting gas clusters. The GCIB system 600 further comprises a beam formation module 620 (generically referred to herein as a second module 620) wherein the gas clusters from the gas cluster formation module 610 are ionized by using an ion source 624, and passed through to a beam modification module 630 (generically referred to herein as a third module 630) having a magnet 632 and a neutralizer 634, which accelerates the ionized gas clusters and neutralizes excess charge buildup within the GCIB system 600. The accelerated ion gas clusters are emitted and passed through a photovoltaic cell region 636. The resulting ionized gas cluster beam 648 collides with a substrate 644 resting on or attached to a mechanically scanned platen 642. In a typical application of the GCIB system, the substrate 644 is a silicon wafer. The substrate 644 and the platen 642 reside in a target module 640 (generically referred to herein as a fourth module 640). The first, second, third and fourth modules may be positioned along a first horizontal x-axis 650.

According to a related aspect of the invention, the GCIB system 600 may include an oblique-angular application of the beam 648 to the substrate 644. The platen 642 may be positioned such that the substrate 644 intercepts the beam 648 at an oblique angle. The platen 642 and thereby the substrate 644 is positioned at an oblique angle from at least one of a vertical y-axis 660, the x-axis 650, or a second horizontal z-axis 670. The y-axis 660 and the z-axis 670 are substantially perpendicular from the horizontal axis 650 along the length of the GCIB modules 610, 620, 630, and 640. In related embodiments, the platen 642 or the substrate 644 may be fixed at an oblique angular position relative to the beam 648, or their angle may be adjustable along the xyz axes using a pivotable member (not shown), connected to the platen 642 to adjust the acute angle at which the substrate 644 intercepts the beam 648. For example, a ball joint connected to the platen 642 may enable x, y, and z adjustments, that is, along the axes 650, 660 and 670. The platen 642 and the substrate 644 are movable along each of the z and y axes 660 and 670.

According to a further embodiment of the disclosed invention, the platen 642 and/or the substrate 644 are additionally configured to move along the axis 650, towards or away from the beam 648 source (i.e., the third module 630), such that the center of the beam 648 collides with the surface of the substrate 644 at a configurable distance, preferably at a substantially equal distance for each portion of the substrate 644 that is scanned by the beam 648. Angularly positioning, i.e., tilting, the platen 642 and the substrate 644 results in one portion of the substrate 644 being closer to the beam 648 than an opposing end. With the beam 648 source being stationary, moving the platen 642 along the axes 660 or 670 (depending on the direction of the tilt) during the GCIB scan process may result in an increased distance between an emission point of the beam 648 from the third module 630 and the surface of the substrate 644 as the length of the substrate 644 is scanned. By allowing the platen 642 to move along the axis 650, therefore, the distance between the emission point of the beam 648 from the third module 630 and the surface of the substrate 644, is configurable, and can be maintained at a substantially constant value. For example, as the beam 648 is projected onto successively farther portions of the substrate 644, the platen 642 may be stepped forward, i.e., moved closer to the beam 648 source, to cancel out the added distance between the two. The reference point for this distance may be, for example, the center of the beam 648 at the point where it collides with the substrate 644.

In a related embodiment, the emission point 636 of the third module 630 is mechanically movable along the axis 650, such that it allows adjustment of the distance travelled by the beam 648 before it is intercepted by the substrate 644. This feature allows the GCIB system 600 to maintain an equal distance between the emission point 636 of the beam 648 and the point of contact on the substrate 644 (measured, for example, at the center of the beam at the point of contact), or to vary the distance in a controlled way.

A given portions(s) of the substrate 644 may be scanned multiple times with varying intensity to achieve a desired level of surface manipulation, such as substantially uniform manipulation. Additionally, the speed at which the platen 642 is moved may be changed to further facilitate this objective.

Using the GCIB system 600, it is possible to treat the surface of the substrate 644 including, for example, finFETs 100 (FIG. 1A-3D), by removing the protective layer 310 once it has been deposited, independently of the method of deposition.

The GCIB system 600 provides for versatile techniques because it can be used with virtually any gas, with varying intensity. Among other applications, it can be used for deposition, etching, and doping steps in the microelectronics fabrication processes. Unlike ion beam milling techniques, the etching process in GCIB is predominantly chemical and can affect removal of shallow films without damage to underlying material. Properties of the beam 648, such as beam size, the number of times it passes over an area of the substrate 644, and related factors depend on the particular application. In embodiment, the substrate 644 is a semiconductor wafer having, for example, a 300 mm diameter. The beam 648 spot size, i.e., the point where it is intercepted by the substrate 644, may be defined by a Gaussian distribution of clusters with full width half maximum of approximately 1 cm in diameter. The wafer may be scanned approximately 100 times from left to right, using an approximately 3 mm step, beginning at a top side of the substrate 644. In an embodiment, the platen 642 is movable along a vertical axis 670 and a second horizontal axis 680 (corresponding to the y-axis and z-axis).

What is claimed is:

1. A method for forming a field effect transistor device, the method comprising:

forming a first semiconductor fin and a second semiconductor fin adjacent to the first semiconductor fin on a semiconductor substrate, the second semiconductor fin separated from the first semiconductor fin by a trench region having at least three sidewalls, wherein opposite facing sidewalls of the first semiconductor fin and the second semiconductor fin define first and second sidewalls of the trench region;

arranging a gate stack over the first semiconductor fin and over the second semiconductor fin, wherein a first sidewall of the gate stack adjacent to the trench region defines a third sidewall of the trench region;

depositing a protective layer on a top surface of the field effect transistor device, wherein the protective layer covers some or all of the top surface; and removing a portion of the protective layer from the top surface of the field effect transistor device using an angled etching process, such that the protective layer remains only along at least the first sidewall of the gate stack and only on a bottom portion of the trench region in direct contact with the semiconductor substrate, wherein the protective layer along the first sidewall of the gate stack defines a gate spacer; wherein the removing the portion of the protective layer comprises:

directing a first ion beam generated by an ion beam source at the semiconductor substrate from a first direction at a first oblique angle, wherein the first oblique angle is measured clockwise from a vertical first axis extending perpendicular from a surface of the substrate to a second axis extending perpendicular from an emission point of the ion beam source, and wherein the first ion beam is perpendicular to a long axis of the first semiconductor fin and further comprising:

directing a second ion beam generated by the ion beam source at the semiconductor substrate from a second direction counterclockwise to the first direction at a second oblique angle, wherein the second oblique angle is measured from the vertical first axis extending perpendicular from the surface of the substrate to the second axis extending perpendicular from the emission point of the ion beam source, and wherein the second ion beam is perpendicular to the long axis of the first semiconductor fin.

2. The method of claim 1, wherein the depositing further comprises conformally depositing the protective layer over the gate stack, the trench region, and over the first and second semiconductor fins, and wherein the removing further comprises removing the protective layer from directly above the gate stack and directly above the first and second semiconductor fins and from the top portion of the trench region, wherein another portion of the protective layer remains along the first sidewall of the gate stack and on the bottom portion of the trench region along the first, second, and third sidewalls of the trench region.

3. The method of claim 1, wherein the angled etching process comprises an ion milling process.

4. The method of claim 1, wherein a material for forming the protective spacer comprises:

oxides, nitrides, oxynitrides, carbon-doped oxides, carbon-doped nitrides, or carbon-doped oxynitrides.

5. The method of claim 1, wherein the protective layer is made from a silicon nitride material.

6. A method for forming a first and second field effect transistor (finFET) devices, wherein for each finFET device of the first and second finFET devices, the method comprises:

forming a first semiconductor fin and a second semiconductor fin on a semiconductor substrate, the second semiconductor fin being adjacent to the first semiconductor fin and separated from the first semiconductor fin by a trench region having at least three sidewalls, wherein opposite facing sidewalls of the first semiconductor fin and the second semiconductor fin define first and second sidewalls of the trench region;

arranging a gate stack over the first semiconductor fin and over the second semiconductor fin, wherein a first sidewall of the gate stack adjacent to the trench region defines a third sidewall of the trench region;

depositing a protective layer on a top surface of the finFET device, wherein the protective layer covers some or all of the top surface; and removing a portion of the protective layer from the top surface of the finFET device using an angled etching process, such that the protective layer remains only along at least the first sidewall of the gate stack and only on a bottom portion of the trench region in direct contact with the semiconductor substrate, wherein the protective layer along the first sidewall of the gate stack defines a gate spacer, wherein the first finFET device is n-doped (NFET device) and the second finFET is p-doped (PFET device), and wherein the angled etching process comprises a gas cluster ion beam (GCIB) process, and wherein the GCIB process comprises using a beam spot size defined by a Gaussian distribution of clusters with full width half maximum of approximately 1 cm in diameter, and a scanning step of 3 millimeters.

7. The method of claim 6, wherein for each of the first and second finFET devices, the depositing further comprises conformally depositing the protective layer over the gate stack, the trench region, and over the first and second semiconductor fins, and wherein the removing further comprises removing the protective layer from directly above the gate stack and directly above the first and second semiconductor fins and from the top portion of the trench region, wherein another portion of the protective layer remains along the first sidewall of the gate stack and on the bottom portion of the trench region along the first, second, and third sidewalls of the trench region.

8. The method of claim 7, wherein the removing the portion of the protective layer further comprises:
   isolating the NFET device using a first masking layer;
   directing a first ion beam at the NFET device to remove the portion of the protective layer from the NFET device;
   isolating the PFET device using a second masking layer; and
   directing a second ion beam at the PFET device to remove the portion of the protective layer from the PFET device.

9. The method of claim 8, wherein a composition of the first ion beam is different from a composition of the second ion beam.

10. The method of claim 9, wherein a thickness of the protective layer of the NFET device is different from a thickness of the protective layer of the PFET device.

* * * * *